United States Patent [19]

Sugita

[11] Patent Number: 5,659,711

[45] Date of Patent: Aug. 19, 1997

[54] MULTIPORT MEMORY AND METHOD OF ARBITRATING AN ACCESS CONFLICT THEREIN

[75] Inventor: Mitsuru Sugita, Hyogo-ken, Japan

[73] Assignee: Mitsubishi Denki Kabushiki Kaisha, Tokyo, Japan

[21] Appl. No.: 298,082

[22] Filed: Aug. 31, 1994

Related U.S. Application Data

[63] Continuation of Ser. No. 850,628, Mar. 13, 1992, abandoned.

[30] Foreign Application Priority Data

Mar. 13, 1991 [JP] Japan ................... 3-048454

[51] Int. Cl.$^6$ ................................. G06F 13/18
[52] U.S. Cl. ............ 395/476; 395/477; 395/495
[58] Field of Search .................... 395/458, 476, 395/477, 495

[56] References Cited

U.S. PATENT DOCUMENTS

| | | | |
|---|---|---|---|
| 4,449,183 | 5/1984 | Flahive et al. | 395/478 |
| 4,796,232 | 1/1989 | House | 365/189 |
| 4,860,263 | 8/1989 | Mattausch | 365/230.05 |
| 4,918,664 | 4/1990 | Platt | 365/230.05 |
| 4,930,066 | 5/1990 | Yokota | 395/476 |
| 4,967,398 | 10/1990 | Jamova et al. | 365/230.05 |
| 5,001,671 | 3/1991 | Koo et al. | 365/230.05 |
| 5,014,247 | 5/1991 | Albachten, III et al. | 365/230.05 |
| 5,142,540 | 8/1992 | Glasser | 371/40.1 |

FOREIGN PATENT DOCUMENTS

| | | |
|---|---|---|
| 62-217481 | 9/1987 | Japan . |
| 63-293785 | 11/1988 | Japan . |
| 1-303694 | 12/1989 | Japan . |

OTHER PUBLICATIONS

Dip.–Ing. Michael Sopott, "Zwei Prozessoren an einem Speicher" Elektronik 14, Jul. 10, 1987, pp. 73–74 and 76.

*Primary Examiner*—Reba I. Elmore
*Attorney, Agent, or Firm*—Lowe, Price, LeBlanc & Becker

[57] ABSTRACT

A multiport memory includes a first memory block and a second memory block which are independently accessible with each other. Each of the first and second memory blocks can be accessed simultaneously through first and second ports. The memory includes a first access conflict detector for detecting an access conflict on the first memory block, a second access conflict detector for detecting an access conflict in the second memory block, a first arbitor responsive to the first detector for arbitrating an access conflict in the first memory block, and a second arbitor responsive to the second detector for arbitrating an access conflict in the second memory block. The memory further includes a selector for transferring the arbitration result of the first arbitor to the second memory block while neglecting the arbitration result of the second arbitor only when both the first and second detector detect the access confliction.

9 Claims, 11 Drawing Sheets

MULTIPORT MEMORY AND METHOD OF ARBITRATING AN ACCESS CONFLICT THEREIN

This application is a continuation of application Ser. No. 07/850,628 filed Mar. 13, 1992, now abandoned.

BACKGROUND OF THE INVENTION

1. Field of the Invention

The present invention relates generally to multiport memories including a plurality of ports which can be accessed independently of each other and, more particularly, relates to structures for effectively avoiding access conflict in dual port memories having two ports.

2. Description of the Background Art

A multiprocessor system has been often used for enhancing performance of a data processing system in recent years. A multiprocessor system is a system including a plurality of CPUs (Central Processing Units). The CPUs operate asynchronously with each other. A multiport memory is used in order to carry out data transmission between the CPUS in an asynchronous manner. The multiport memory includes a plurality of ports which can be accessed independently of each other. A multiport memory having two ports is called a dual port memory.

FIG. 6 is a diagram schematically showing a structure of a multiprocessor system. In FIG. 6, a dual port memory 120 is located between a first CPU 100 and a second CPU 110. Dual port memory 120 includes an L port 120L and an R port 120R which can be accessed independently of each other. L port 120L includes a control input port CTL for receiving a control signal, a data input/output port IOL for inputting/outputting data, and an address input port ADL for receiving an address signal. Similarly, R port 120R includes a control signal input port CTR, a data input/output port IOR and an address input port ADR. The first CPU 100 is capable of input/output of data with L port 120L of dual port memory 120.

R port 120R is capable of input/output of data with the second CPU 110. L port 120L and R port 120R can operate independently of each other. Accordingly, CPUs 100 and 110 can access the dual port memory 120 and write/read data asynchronously with each other. As a result, the first CPU 100 and the second CPU 110 can transmit data therebetween while operating asynchronously with each other, using the dual port memory 120 as a buffer memory.

FIG. 7 is a diagram schematically showing the structure of the dual port memory. In FIG. 7, dual port memory 120 includes a memory cell array 211 commonly provided for R port 120R and L port 120L. Memory cell array 211, the structure of which will be described later, includes a plurality of memory cells arranged in a matrix of rows and columns.

R port 120R includes an address buffer 212 for receiving an address A0 (R) to An (R) supplied to address input port ADR and generating an internal address, a row decoder 213 for decoding an internal row address from address buffer 212 and selecting a corresponding row in memory cell array 211, a column decoder 214 for decoding an internal column address from address buffer 212 and selecting a corresponding column in memory cell array 211, and an I/O buffer (input/output circuit) 215 for transmitting data between data input/output port IOR and a memory cell selected by row decoder 213 and column decoder 214. I/O buffer 215 generates internal write data from write data DIN (R) supplied to data input/output port IOR. I/O buffer 215 also generates external read out data DOUT (R) from data on a column selected by column decoder 214.

Control on data input and output by I/O buffer 215 is performed by a control circuit (not shown). Although FIG. 7 shows as if I/O buffer 215 is connected to column decoder 214, actually, a corresponding column is selected by column decoder 214 from memory cell array 211 and the selected column is connected to an internal data bus. I/O buffer 215 is connected to the internal data bus. FIG. 7, does not show the structure of a selection gate for connecting a column selected by column decoder 214 to the internal data bus, in order to simplify the figure.

Similarly, L port 120L includes an address buffer 216 for generating an internal address from an address A0 (L) to An (L) supplied to address input port ADL, a row decoder 217 for decoding an internal row address from address buffer 216 and selecting a corresponding row in memory cell array 211, and a column decoder 218 responsive to an internal column address from address buffer 216 for selecting a corresponding column in memory cell array 211. L port 120L further includes an I/O buffer 219 for transmitting data between a memory cell in memory cell array 211 selected by row decoder 217 and column decoder 218 and an external portion (CPU) of the device. In data writing operation, I/O buffer 219 generates internal write data from external write data DI (L) supplied to data input/output port IOL and transmits the same onto a column within memory cell array 211 selected by column decoder 218. In data reading operation, I/O buffer 219 generates external read out data DOUT (L) from data on a column in memory cell array 211 selected by column decoder 218 and transmits the same to data input/output port IOL.

CPUs 110 and 100 connected to R port 120R and L port 120L can operate to perform addressing independently of each other. Dual port memory 120 shown in FIG. 7 has an L port control circuit and an R port control circuit, each of which is not explicitly shown, and each port can operate independently of each other under the control of the control circuits. Accordingly, CPU 100 and CPU 110 can operate in an asynchronous manner to carry out addressing and read out/write data from/into a corresponding memory cell.

As CPU 100 and CPU 110 operate independently of each other, there are some cases, where an address A0 (L) to An (L) supplied to L port 120L is the same as an address A0 (R) to An (R) supplied to R port 120R and the same memory cell is selected in memory cell array 211. A state in which the address A0 (L) to An (L) supplied to L port 120L is totally the same as the address A0 (R) to An (R) supplied to R port 120R is called "address conflict" or "access conflict". If such an address conflict or access conflict is caused, an unpreferable situation is brought about in a case in which either of L port 120L and R port 120R is in a data writing mode though there is no problem in a case in which both of them are in a data reading mode. A description will be made below of this situation.

FIG. 8 is a diagram showing a structure of a portion related to a memory cell of 1 bit in memory cell array 211. In FIG. 8, a memory cell MC has a memory cell structure of a flipflop type. FIG. 8 illustrates a structure of an inverter latch in which memory cell MC includes a pair of inverters in anti-parallel connection. Storage nodes Na and Nb in memory cell MC latch data complementary to each other.

Two word lines WLL and WLR and two pairs of bit lines BLL and BLR are provided for memory cell MC. A word line driving signal WLL from row decoder 217 for the L port shown in FIG. 7 is transmitted to word line WLL and a word line driving signal WLR from row decoder 213 for the R port shown in FIG. 7 is transmitted to word line WLR. Here, a signal line and a signal to be transmitted onto the signal line are represented by the same reference numeral. One row of memory cells are connected to word lines WLL and WLR.

Bit line pair BLL includes bit lines BLLa and BLLb on which data complementary to each other are transmitted. Bit line pair BLR includes bit lines BLRa and BLRb on which data complementary to each other are transmitted.

For memory cell MC, there are provided transfer gate transistors STLa and STLb responsive to a signal potential on word line WLL for connecting storage nodes Na and Nb of memory cell MC to bit lines BLLa and BLLb, respectively, and transfer gate transistors STRa and STRb responsive to a signal potential on word line WLR for connecting storage nodes Na and Nb to bit lines BLRa and BLRb, respectively.

For bit line pair BLL, there are provided column selection gates CSLa and CSLb which are turned on in response to a column select signal CDLi from column decoder 218 for the L port shown in FIG. 7, for connecting bit lines BLLa and BLLb to internal data bus lines CBLa and CBLb for the L port, respectively.

For bit line pair BLR, there are provided column selection gates CSRa and CSRb which are turned on in response to a column select signal CDRi from column decoder 214 for the R port shown in FIG. 7, for connecting bit lines BLRa and BLRb to internal data bus lines CBRa and CBRb for the R port.

One column of memory cells are connected to bit line pairs BLL and BLR. Internal data bus lines CBLa and CBLb constitute an internal data bus CBL and internal data bus lines CBRa and CBRb constitute an internal data bus CBR. Internal data bus CBL is connected to I/O buffer 219 for the L port shown in FIG. 7 and internal data bus CBR is connected to I/O buffer 215 for the R port shown in FIG. 8.

In the structure shown in FIG. 8, if word line WLL is selected, memory cell MC is connected to bit line pair BLL (bit lines BLLa and BLLb). If word line WLR is selected, memory cell MC is connected to bit line pair BLR (bit lines BLRa and BLRb). Bit line pairs BLL and BLR are connected to internal data buses CBL and CBR by column select signals CDLi and CDRi, respectively.

In a case of an address conflict or access conflict, word lines WLL and WLR are simultaneously selected and bit line pairs BLL and BLR are also selected.

If L port 120L and R port 120R are both in the data reading mode, data of memory cell MC is transmitted to common internal data buses CBL and CBR, causing no problem.

Now consider a case where L port 120L writes data into memory cell MC and R port 120R reads out data from the same memory cell MC. If data is written into memory cell MC from L port 120L, the contents stored in memory cell MC change according to the written data. Accordingly, R port 120R can not read out the contents stored in memory cell MC before the data writing, so that correct data can not be read out. That is, according to the timing relationship between the point of reading out data from R port 120R and the point of change of the contents stored in memory cell MC due to data writing from L port 120L there are cases (1) where data of changed content stored in memory cell MC is read out, (2) where data before change is read out, and (3) where the time of reading data just coincides with the time of data change (a cross point of information on the bit lines), so that data is not settled and can not be read out correctly.

Therefore, in the case of the access conflict, it is necessary to perform access arbitration, in which if at least one of the CPUs requires data writing, access by only one port is permitted and access by the other port is inhibited.

A conflict avoidance circuit 220 as shown in FIG. 7 is generally provided in order to prevent such an access conflict. Conflict avoidance circuit 220 receives an address ADL and a chip select signal *CSL supplied to the L port and an address ADR and a chip select signal *CSR supplied to the R port. Conflict avoidance circuit 220 determines which of the addresses ADL and ADR of the two ports is settled first if the address ADL from the L port and the address ADR from the R port coincide with each other. In accordance with the result of the determination, conflict avoidance circuit 220 accepts accessing to the port for which the address was settled first, making it possible to access the port while generating a busy signal BUSY indicating prohibition of accessing to the other port and inhibiting data accessing to the other port.

As a method for conflict avoidance circuit 220 to determine which port should be accessed first, there two methods of detecting the point of change of the address and of detecting the point when the chip select signal is brought to an active state. A specific structure of such a conflict avoidance circuit is described, for example, in Japanese Patent Laying-Open No. 1-303694, and Japanese Patent Laying-Open No. 62-217481.

With use of this conflict avoidance circuit 220, even if the addresses of the two ports are the same, accessing is only allowed for the port for which the address was settled first, so that no access conflict is caused and data can be processed correctly.

While the bit width of data in such a dual port memory is 8 bits in many cases, the data bit width has been increasing, such as 16 bits and 32 bits in a CPU in recent years. In such a case, it is necessary to use a plurality of dual port memories. As shown in FIG. 9, word data and byte data are included in data required by a CPU of 16 bits, even if a dual port memory of a data width of 16 bits is employed for the CPU of 16 bits. It is necessary in a dual port memory of 16 bits as well to divide the dual port memory of 16 bits into two memory blocks, i.e., a high order byte memory and a low order byte memory and to enable accessing on an 8-bit basis as the word data includes 16 bits and the byte data includes 8 bits.

If two memories or memory blocks are employed and a conflict avoidance circuit is provided for each memory or memory block in this way, access conflict can not be efficiently avoided. This problem will be discussed in the following.

FIG. 10 is a diagram showing a schematic structure of a dual port memory of 16 bits which can be accessed on an 8-bit basis. A dual port memory 300 includes a high order byte memory block (or memory chip) 310 for supplying data of high order byte and a low order byte memory block (or memory chip) 320 for inputting/outputting data of low order byte. For high order byte memory block 310, a conflict avoidance circuit 311 is provided for avoiding conflict with the high order byte data. For low order byte memory block 320, there is provided a conflict avoidance circuit 321 for avoiding an access conflict for the data of low order byte. High order byte memory block 310 inputs/outputs high order byte data DLH and DRH independently through the L port and the R port, respectively. Conflict avoidance circuit 311 determines whether or not there is a conflict of accessing to the L port and the R port for respective high order byte data, then performs a conflict avoiding operation according to the result of the determination and supplies access enabling signals (busy signals) BYLH and BYRH indicating whether or not the L port and the R port can be accessed, respectively.

Low order byte memory block 320 inputs/outputs low order byte data DLL and DRL through the L port and the R port. Access conflict avoidance circuit 321 determines whether or not there is a conflict in accessing through the L port and the R port for the low order byte data, performs an access conflict avoiding operation according to the result of the determination, and supplies access enabling signals BYLL and BYRL to the L port and the R port, respectively. In the case of the structure shown in FIG. 10, access conflict avoidance circuit 311 provided for memory block 310 and access conflict avoidance circuit 321 provided for low order byte memory block 320 perform conflict avoiding operations independently of each other. Accordingly, with this structure, if the L port and the R port are accessed on a byte basis, data can be input/output according to the conflict avoiding operations by the respective conflict avoidance circuits.

If one port is accessed on a byte basis and the other port is accessed on a word basis, since the byte data and the word data normally have different addresses with each other, no access conflict is caused and data can be input/output according to the avoiding operations of conflict avoidance circuits 311 and 321 in this case as well.

If the both ports are accessed on a word basis, however, a problem arises. Conflict avoidance circuits 311 and 321 each have independent circuit structures. In this case, the determination result by conflict avoidance circuit 311 may be different from that by conflict avoidance circuit 321 as the operation characteristics are different due to fluctuations of circuit parameters during manufacturing processes and as signal delays in signal wirings inside the circuits are different.

For example, there may be a case where conflict avoidance circuit 311 for the higher order byte data gives priority to the L port while conflict avoidance circuit 321 for the low order byte data gives priority to the R port. In this case, the CPU can not input/output data on a word basis. For such a situation, two cases can be considered as a method of accessing data by the CPU, that is, (1) in which data is input/output on the basis of a byte for which accessing is permitted and the remaining byte data is accessed again or is brought to a wait state and (2) in which accessing is repeated until access on a word basis is permitted. In either case, the processing speed of the CPU is considerably decreased.

Japanese Patent Laying-Open No. 63-29378, for example, discloses a structure in which only one access conflict avoidance circuit is operated for a plurality of memory circuits or memory blocks and access arbitration for all the memory circuits or memory blocks is carried out according to the determination result of the one access conflict avoidance circuit in order to overcome the disadvantage of the structure where access conflict avoiding operations are independently performed for the plurality of memory circuits or memory blocks.

FIG. 11 is a diagram showing an outside structure of a memory device described in the above-mentioned prior art reference, for carrying out access arbitration for a plurality of memory circuits (memory blocks) using a conflict avoidance circuit provided in one block. In FIG. 11, the memory device includes memory circuits 410 and 420. Memory circuits 410 and 420 may be formed on separate chips, or may be memory blocks formed on the same chip and capable of operating independently of each other. Memory circuits 410 and 420 have the same structures and include L ports and R ports which can be accessed independently. The both L ports of memory circuits 410 and 420 constitute an L port 440 and the both R ports of memory circuits 410 and 420 constitute an R port 430. Memory circuit 410 and memory circuit 420 can be accessed independently of each other.

The L port of memory circuit 410 includes a terminal *CSL for receiving a chip select signal $\phi$USL, a terminal *CSIL for receiving a chip select signal $\phi$LSL for the other memory circuit 420, a terminal CONL for supplying the result of determination of access conflict avoidance, a terminal I/OL for inputting/outputting data, and an address input terminal ADL for receiving an address L. Terminal CONL supplies to the CPU a signal CONL indicating whether or not the port can be accessed, which corresponds to a normal busy signal (BUSY signal).

Similarly, the R port of memory circuit 410 includes a terminal *CSR for receiving a chip select signal $\phi$USR, a terminal *CSIR for receiving a chip select signal $\phi$LSR supplied to the other memory circuit 420, a terminal CONR for supplying a signal CONR indicating the result of conflict avoidance determination, a data input/output terminal I/OR and an address input terminal ADR for receiving an address R. Memory circuit 410 further includes a control terminal MM for receiving a control signal $\phi$M for enabling/disabling the access conflict avoidance circuit included therein.

The L port of memory circuit 420 includes a terminal *CSL for receiving a chip select signal $\phi$LSL, a terminal CONL for receiving a signal CONL indicating the result of access conflict avoidance determination from memory circuit 410, a terminal I/OL for inputting/outputting data, and an address input terminal ADL for receiving an address L. Similarly, the R port of memory circuit 420 includes a terminal *CSR for receiving a chip select signal $\phi$LSR, a terminal CONR for receiving a signal CONR indicating the result of conflict avoidance determination from memory circuit 410, a terminal I/OR for inputting/outputting data, an address input terminal ADR for receiving an address R, and a terminal MM for receiving a control signal *$\phi$M for enabling/disabling an access conflict avoidance circuit included therein. The control signal *$\phi$M is an inverted signal of the control signal $\phi$M. In the structure shown in FIG. 11, the access conflict avoidance circuit included in memory circuit 410 is enabled and the access conflict avoidance circuit included in memory circuit 420 is disabled. Terminals *CSIL and *CSIR of memory circuit 420 are both brought into an open state. The same address L is applied to address input terminal ADL of memory circuit 410 and address input terminal ADL of memory circuit 420. The same address R is supplied to address input terminal ADR of memory circuit 410 and address input terminal ADR of memory circuit 420. In this structure, the chip select signals $\phi$USL, $\phi$USR, $\phi$LSL and $\phi$LSR select high order byte data only, low order byte data only, or the word data.

In the structure shown in FIG. 11, the access conflict avoidance circuit included in memory circuit 410 is operated to generate conflict avoidance determination result indicating signals CONL and CONR according to the signals $\phi$USL, $\phi$USR, $\phi$LSL, and $\phi$LSR and the addresses L and R supplied to terminals *CSL, *CSR, *CSIL, *CSIR, ADL and ADR.

Memory circuit 420 is enabled in response to the control signals $\phi$LSL and $\phi$LSR, the address L (ADL) and the address R (ADR), and writes/reads data corresponding to one port according to the conflict avoidance determination result indicating signals CONL and CONR from memory circuit 410 when an access conflict is caused. That is, in memory circuits 410 and 420, data is written/read out according to the result of avoidance determination of the access conflict avoidance circuit included in memory circuit 410.

If data is written in/read out from memory circuit 420, the chip select signals φLSL and φLSR attain "L" level of an active state and the chip select signals φUSL and φUSR attain "H" of an inactive state. The signals φLSL and φLSR are also supplied to terminals *CSIL and *CSIR of memory circuit 410. Memory circuit 410 operates the access conflict avoidance circuit included therein according to the signals supplied to terminals *CSIL and *CLIR, detects a conflict between addresses supplied to address input terminals ADL and ADR to perform the conflict avoidance determining operation, and supplies the result of the determination from terminals CONL and CONR. In memory circuit 420, data for one port is written/read out according to the conflict avoidance determination result indicating signals CONL and CONR from memory circuit 410 when a conflict is caused.

FIG. 12 is a diagram showing a structure of a portion related to access conflict avoidance operation in the memory circuit shown in FIG. 11. In FIG. 12, a conflict avoidance control portion includes an AND gate AN1 for receiving a chip select signals supplied to terminals *CSL and *CSIL, an AND gate AN6 for receiving chip select signals supplied to terminals *CSIR and *CSR, and a conflict avoidance circuit 450 for performing a determining operation in order to avoid a conflict according to the outputs of AND gates AN1 and AN6 and internal control signals φL and φR to supply a determination result signal and supplying a port enable signal according to the determination result.

The internal control signals φL and φR may be port enable signals from a memory control (not shown) provided for a memory port. The internal control signals φL and φR may be internal address signals. If the control signals φL and φR are internal control signals, i.e., port enable signals, an internal address signal is additionally supplied to conflict avoidance circuit 450. Conflict avoidance circuit 450 performs a conflict avoiding operation, depending on whether or not a conflict is caused and according to the result of the determination to supply an avoidance determination result signal and a port enable signal in accordance with the chip select signals φUSL, φLSL, φUSR, and *φLSR supplied to terminals *CSL, *CSIL, *CSIR, and *CSR and the addresses ADL and ADR.

The conflict avoidance control portion further includes tristate buffers T1 and T2 responsive to a control signal supplied to terminal MM for setting terminal CONL to be either an input terminal or an output terminal, a tristate buffer T3 for transmitting an avoidance determining operation result signal from conflict avoidance circuit 450 to tristate buffer T2, an AND gate AN2 which is enabled/disabled according to the control signal supplied to terminal MM, for taking a logical product of an internal control signal and an output of tristate buffer T3 or T1, an AND gate AN3 for taking a logical product of an L port enable signal from conflict avoidance circuit 450 and the control signal supplied to terminal MM, and an OR gate O1 for taking a logical sum of the outputs of AND gates AN2 and AN3. An L port enable signal φLE is supplied from OR gate O1. The control signal φLE may be a control signal for enabling/disabling the input/output circuit of the L port. The control signal φLE may be a signal supplied to a decoder if the internal control signal φL is an external address signal.

Also the R port, in the same way as for the L port, includes tristate buffers T5 and T6 responsive to a control signal supplied to control terminal MM for switching terminal CONR to an input terminal or an output terminal, a tristate buffer T4 for transmitting a conflict avoidance determination result signal from conflict avoidance circuit 450, an AND gate AN5 which is enabled/disabled according to a control signal supplied to terminal MM, for taking a logical product of an internal control signal φR and an output of tristate buffer T4, an AND gate AN4 for taking a logical product of an R port enable signal from conflict avoidance circuit 450 and the control signal supplied to terminal MM, and an OR gate O2 for taking a logical sum of the outputs of AND gates AN4 and AN5. The R port enable signal φRE is supplied from OR gate O2. The control signal φRE may also be an internal address signal supplied to the decoder in the same way as the control signal φLE or may be a control signal for enabling/disabling the input/output circuit. The operation thereof will now be described in the following.

If the control signal supplied to terminal MM is set at "H" level, tristate buffer T1 is brought to an output high impedance state, tristate buffer T2 is brought to an operating state, and terminal CONL becomes an output terminal for supplying an avoidance determination result signal CONL. Tristate buffers T3 and T4 are also brought to the operating state in which they transmit a conflict avoidance determination result signal from conflict avoidance circuit 450. Furthermore, AND gates AN2 and AN5 have their outputs fixed to "L", and AND gates AN3 and AN4 are brought to a state in which they transmit an L port enable signal and an R port enable signal from conflict avoidance circuit 450. In this state, OR gates O1 and O2 supply the outputs of AND gates AN3 and AN4 as an L port enable signal φLE and an R port enable signal φRE, respectively.

If a signal of "H" is supplied to terminal MM, tristate buffer T5 is enabled, tristate buffer T6 is brought to the output high impedance state and terminal CONR is set to be an output terminal.

In this state, if chip select signals φUSL and φUSR are supplied to terminals *CSL and *CSR, a memory control circuit included therein is enabled, and generates an internal control signal for enabling each port. The control signals φUSL and φUSR attain "L" when both of them are active and attain "H" when they both are inactive. Accordingly, the chip select signals φUSL and φUSR are supplied to conflict avoidance circuit 450 through AND gates AN1 and AN6. Conflict avoidance circuit 450 makes a determination for avoiding a conflict according to the output signals from AND gates AN1 and AN6, the control signals φL and φR, and the internal addresses ADL and ADR (not clearly shown in the figure; for the case in which the signals φL and φR do not include an internal address).

The determination result from conflict avoidance circuit 450 is supplied from terminal CONL through tristate buffers T3 and T2 and also supplied from terminal CONR through tristate buffers T4 and T5. The determination result signals of terminals CONL and CONR are supplied to terminals CONL and CONR of the other memory circuit 420 and an access conflict avoiding operation is carried out in the other memory 420 according to the determination result signals CONL and CONR.

AND gates AN3 and AN4 each transmit a port enable signal from conflict avoidance circuit 450. OR gates O1 and O2 supply port enable signals φLE and φRE.

If chip select signals φLSL and φLSR are supplied to terminals *CSIL and *CSIR from the other memory circuit 420, the memory control is not activated in memory circuit 410. At this time, conflict avoidance circuit 450 carries out the conflict avoiding operation according to the chip select signals from AND gates AN1 and AN6 and the internal addresses. If the internal control signals φL and φR are internal control signals, both of them are in a disabled state, a port enable signal is not supplied from conflict avoidance circuit 450 and the port enable signals φLE and φRE are in an inactive state. If the internal control signals φL and φR are address signals, while the signals φLE and φRE are generated, the memory control provided in each port is in an non-activated state, so that a selecting operation for the memory is not carried out and each port in the memory is disabled.

Conflict avoidance circuit 450 performs a conflict avoidance determining operation according to the addresses and the chip select signals (the outputs of AND gates AN1 and AN6) and supplies a signal indicating the result of the determination to terminal CONL through tristate buffers T3 and T2 and to terminal CONR through tristate buffers T4 and T5. Accordingly, if the other memory, i.e., the memory of high order byte is accessed, the ports of the memory are selectively enabled according to the avoidance determination result signals from terminals CONL and CONR.

A description will now be made of the operation in a case in which terminal MM is set at "L". This corresponds to the operation of the conflict avoidance circuit included in memory circuit 420 in FIG. 11. At this time, tristate buffers T2, T3 and T5 are brought to the output high impedance state of the disable state and tristate buffers T1 and T6 are enabled. The outputs of AND gates AN3 and AN4 are fixed to "L" and AND gates AN2 and AN5 are enabled. Accordingly, in this case, the port enable signals φLE and φRE correspond to the outputs of AND gates AN2 and AN5 since OR gates O1 and O2 transmit the outputs of AND gates AN2 and AN5.

If terminal ME is set at "L" level, the determination result signals CONL and CONR are supplied to AND gates AN2 and AN5 through tristate buffers T1 and T6. AND gates AN2 and AN5 pass the internal control signals φL and φR according to the avoidance determination result signals CONL and CONR. As a result, internal control signals φLE and φRE are supplied. In this case, since the chip select signal φLSL has been supplied to terminal *CSL and the chip select signal φLSR has been supplied to terminal *CSR in memory circuit 420 where terminal MM is set at "L", each memory control is in the operating state and internal control signals φL and φR are generated.

As stated above, it is designed to overcome disadvantages caused when the conflict avoidance circuits provided for the memory circuits are operated independently in a construction in which a plurality of memory circuits are arranged to be operable in parallel, by driving an access conflict avoidance circuit only in one memory circuit to control the operation of the plurality of memory circuits.

The following problem arises in a structure in which an access conflict avoidance determination is made with respect to a plurality of memory circuits using one access conflict avoidance circuit as stated above. That is, if high order byte data, for example, is accessed from the L port and low order byte data is accessed from the R port, no access conflict is caused, so that it is not necessary to perform a conflict avoidance determining operation. If a commonly provided access conflict avoidance circuit is used in this way, however, the access conflict avoidance determining operation is carried out (AND gates AN1 and AN6 make an access detection), and ports of each memory are controlled according to the determination result. Accordingly, in this case, an erroneous port control is carried out, causing the CPU to be in a wait state, so that data can not be processed at high speed.

If the byte data is accessed from one port and the word data is accessed from the other port, generally, no access conflict is generated since byte data and word data normally have different addresses with each other. In this case as well, the access conflict avoidance determining operation is performed, that is, an unnecessary determining operation is performed, so that the access time for the CPU is disadvantageously increased.

That is, in the structure of the conventional access conflict avoidance circuit, there are disadvantages that a correct access conflict avoidance can not be carried out and a useless access conflict avoiding operation is performed for some combination of address conflicts. The above-mentioned prior art article also discloses a structure in which the access conflict avoidance circuit is enabled all the time in one memory circuit, the access conflict avoiding operation for the other memory circuit is controlled if an access conflict is caused in the one memory circuit, while the access conflict avoiding operations are carried out independently if there is no access conflict caused in one memory circuit. However, also in this structure, the same problem is caused in which it is determined that an access conflict is caused in the one memory circuit when the high order byte data and the low order byte data are accessed independently in accessing data on a byte basis.

SUMMARY OF THE INVENTION

Therefore, an object of the present invention is to provide a multiport memory capable of performing an effective and most suitable access conflict avoiding operation for any combination of access conflicts.

Another object of the present invention is to provide a method of effectively arbitrating an access confliction in a multiport memory.

A multiport memory according to the present invention includes a plurality of memory blocks which can be accessed independently through first and second ports, access conflict detection means provided for each of the memory blocks for detecting whether or not there is an access conflict for a related memory block, access conflict avoidance means provided corresponding to each of the access conflict detection means and responsive to a detection signal from a corresponding access conflict detection means for generating a control signal for avoiding an access conflict for a related memory block, means responsive to output signals from the plurality of access conflict detection means for selectively passing output signals of the plurality of access conflict avoidance means, and means for enabling a port of a related memory block according to a control signal from the access conflict avoidance means selected by the selection means.

The selection means selects the output signal of each access conflict avoidance circuit depending on whether or not an access conflict is caused in the plurality of memory blocks. The port enable means enables the port so that the access conflict avoidance is carried out according to the output of the selection means. Accordingly, as the selection means selects an output of the outputs of the conflict avoidance means so that most suitable access conflict avoidance is carried out according to the combination of the caused access conflicts, it is possible to perform most suitable access conflict avoidance for any combination of access conflicts.

In a method of arbitration between access conflicts according to the present invention, an arbitration is independently carried out for each memory block. However, if all the memory blocks cause an access conflict, an arbitration for one memory block is applied to all the remaining memory blocks. Consequently, access conflicts can be avoided effectively and optimally.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
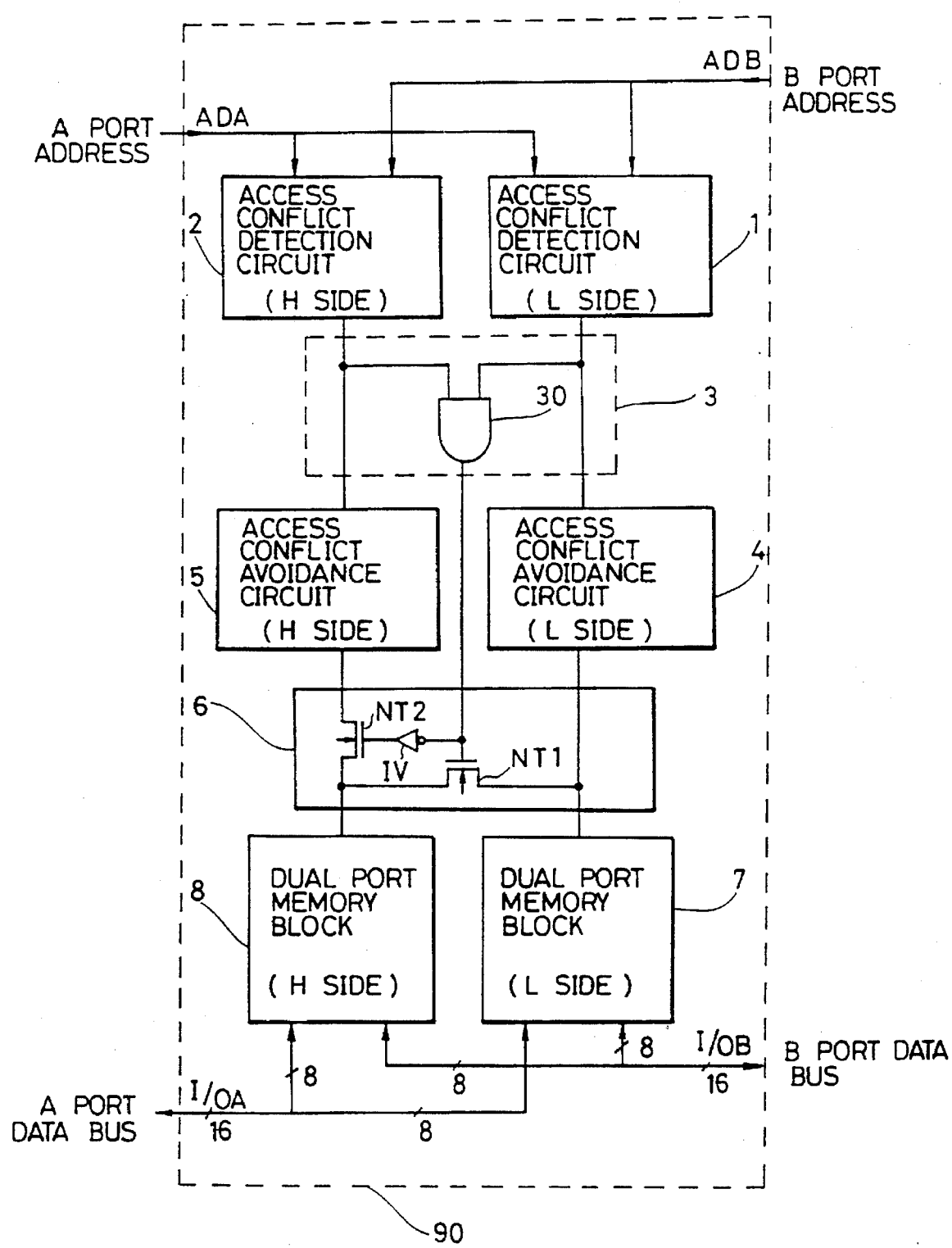
FIG. 1 is a diagram schematically showing an overall structure of a dual port memory in accordance with one embodiment of the present invention.

FIG. 1 is a diagram schematically showing a structure of a dual port memory in accordance with one embodiment of the present invention. In FIG. 1, a dual port memory 90 includes two independently accessible dual port memory blocks 7 and 8. Dual port memory block 7 stores low order byte data and dual port memory block 8 stores high order byte data. Dual port memory blocks 7 and 8 can input/output data to/from outside of the device (a CPU and so on) through a B port data bus I/OB and an A port data bus I/OA, respectively, wherein the ports of dual port memory 90 are called A port and B port. Though they may be referred to as an R port and an L port, since "R port" and "L port" could imply a right side port and a left side port, representing the positional relationship therebetween, they are called A port and B port in the following description. Dual port memory blocks 7 and 8 are capable of inputting/outputting byte data of 8 bits. Accordingly, B port data bus I/OB and A port data bus I/OA are signal lines each having a 16-bit width.

Dual port memory 90 further includes access conflict detection circuits 1 and 2 for detecting whether or not an access conflict is caused by receiving an A port address ADA supplied through the A port and an B port address ADB supplied through the B port and detecting a coincidence/non coincidence therebetween. Access conflict detection circuit 1 is provided corresponding to dual port memory block 7 for low order byte data and access conflict detection circuit 2 is provided for dual port memory block 8 for high order byte data.

For access conflict detection circuits 1 and 2, there are provided access conflict avoidance circuits 4 and 5 for performing an access conflict avoiding operation and supplying a conflict avoidance determination result signal. Access conflict avoidance circuit 4 performs the access conflict avoiding operation for dual port memory block 7 for low order byte data and access conflict avoidance circuit 5 carries out the access conflict avoiding operation for dual port memory block 8 for high order byte data.

Dual port memory 90 further includes a determination circuit 3 for receiving output signals of access conflict detection circuits 1 and 2 and determining whether or not an access conflict is caused in both of memory blocks 7 and 8 in order to effectively perform the access conflict avoiding operation, and a selection control circuit 6 responsive to a determination signal of determination circuit 3 for selectively transmitting avoidance result signals from access conflict avoidance circuits 4 and 5 to memory blocks 7 and 8. Determination circuit 3 includes, for example, an AND gate 30 for taking a logical product of output signals of detection circuits 1 and 2. Selection control circuit 6 includes a transfer gate NT1 which is turned on in response to an output signal of determination circuit 3, for transmitting an avoidance determination result signal from access conflict avoidance circuit 4 to memory block 8, an inverter circuit IV for receiving a determination result signal of determination circuit 3, and a transfer gate NT2 which is turned on by an output signal of inverter circuit IV, for transmitting an avoidance determination result signal from access conflict avoidance circuit 5 to memory block 8. Transfer gates NT1 and NT2 are complementarily turned on. The operation thereof will briefly be described in the following.

Access conflict detection circuits 1 and 2 detect a coincidence/non coincidence between the A port address ADA and the B port address ADB. If there is a coincidence therebetween, they supply a signal of "H" in an active state.

(1) A case where both of the outputs of detection circuits 1 and 2 are at "L":

In this case, there is no access conflict for memory blocks 7 and 8. Accordingly, no conflict avoidance determining operations are not needed at all. At this time, the output of AND gate 30 included in determination circuit 3 is at "L", transfer gate NT1 is turned off, and transfer gate NT2 is turned on. As a result, access conflict avoidance circuit 4 is connected to memory block 7 and access conflict avoidance circuit 5 is connected to memory block 8.

The conflict avoidance determining operations by access conflict avoidance circuits 4 and 5 are not performed since access conflict detection circuits 1 and 2 do not detect any access conflict. An access is made according to the A port address ADA and/or the B port address ADB and data is input/output through A port data bus I/OA and/or B port data bus I/OB in memory blocks 7 and 8.

(2) A case where access conflict detection circuit 1 detects a conflict while access conflict detection circuit 2 does not detect any access conflict:

In this case, the output of AND gate 30 included in determination circuit 3 is at "L". Access conflict avoidance circuit 4 is activated in response to an access conflict detection signal from access conflict detection circuit 1, carries out the access conflict avoiding operation, and supplies a conflict avoidance determination result signal to memory block 7. In memory block 7, selection of port is made according to the conflict avoidance determination result signal from access conflict avoidance circuit 4 and data is written/read out through thus selected one port.

As the output of conflict detection circuit 2 is at "L", access conflict avoidance circuit 5 performs no conflict avoiding operation. The output of AND gate 30 included in determination circuit 3 is at "L", transfer gate NT2 is in an ON state, and transfer gate NT1 is an OFF state. Data is written/read out according to the supplied address(es) ADA and/or ADB in the same way as under normal circumstances since no conflict avoidance determination is made in access conflict avoidance circuit 5.

(3) A case where access conflict detection circuit 1 detects no access conflict while access conflict detection circuit 2 detects an access conflict:

In this case as well, the output of AND gate 30 in determination circuit 3 is at "L", transfer gate NT1 is turned off, and transfer gate NT2 is turned on. Access conflict avoidance circuit 4 does not carry out the conflict avoiding operation. Memory block 7 reads/writes data through A port data bus I/OA and/or B port data bus I/OB according to the supplied address(es) ADA and/or ADB.

Access conflict avoidance circuit 5 is activated in response to an access conflict detection signal from access conflict detection circuit 2, carries out the access conflict avoiding operation, and supplies and transmits an avoidance determination result signal to dual port memory block 8 through transfer gate NT2. In memory block 8, selection of a port is made according to the conflict avoidance determination result signal from access conflict avoidance circuit 5 and data is written/read out through the selected port.

As stated above, if an access conflict is caused only in one memory block, the access conflict avoiding operation is carried out only for the memory block where the access conflict is caused, so that an unnecessary conflict avoiding operation is not performed even in a case where high order byte data and low order byte data are requested to be accessed through different ports and a correct and efficient access conflict avoiding operation can be realized.

(4) A case where access conflicts are caused in both of memory blocks 7 and 8:

In this case, both outputs of access conflict detection circuits 1 and 2 attain "H" of the active state. Determination circuit 3 determines that there is a need for switching conflict control and, at this time, the output of AND gate 30 attains "H". As a result, transfer gate NT1 is turned on and transfer gate NT2 is turned off in selection control circuit 6. In this state, a conflict avoidance determination result from access conflict avoidance circuit 4 is supplied to both of memory blocks 7 and 8. Conflict avoidance circuits 4 and 5 perform the conflict avoiding operation in response to conflict detection signals from access conflict detection circuits 1 and 2. In this case, however, the conflict determination result signal from access conflict avoidance circuit 4 is supplied to both of memory blocks 7 and 8. Accordingly, the same port is selected in memory blocks 7 and 8, settling the problem in which the selected port in memory block 7 is different from the selected port in memory block 8.

In the structure stated above, determination circuit 3 and selection control circuit 6 constitute selection means responsive to detection result signals from access conflict detection circuits 1 and 2 for selecting avoidance determination result signals from access conflict avoidance circuits 4 and 5 for avoiding the conflict, and supplying the same to each of memory blocks 7 and 8.

In accordance with the above-mentioned control structure, if it is necessary to control an access conflict of only one of memory block 7 for low order byte data and memory block 8 of high order byte data, the conflict avoidance is controlled using access conflict avoidance circuit 4 or 5 provided corresponding to each of memory blocks 7 and 8. If it is necessary to control access conflicts for both of memory block 7 for low order byte data and memory block 8 for high order byte data, the conflict avoidance controlling operations can be allowed to coincide with each other for high order byte data memory block 8 and low order byte data memory block 7 by using only one, that is, the avoidance determination result of access conflict avoidance circuit 4 provided for low order byte data memory block 7. As a result, any combination of access conflicts can be dealt correctly and efficiently.

In this case, though the output signals of access conflict avoidance circuits 4 and 5 are shown including 1 bit, respectively, they may be signals of a plurality of bits, and any signal that controls enable/disable of respective ports of memory blocks 7 and 8 may be acceptable. Transfer gate NT2 included in selection control circuit 6 may be provided between access conflict avoidance circuit 4 and memory block 7.

Furthermore, the AND gate included in determination circuit 3 may be a coincidence detection circuit for detecting a coincidence/non-coincidence between the outputs of detection circuits 1 and 2. In a case in which such a coincidence detection circuit (ExNOR circuit) is employed, if a conflict is caused in either one of high order byte data memory block 8 and low order byte data memory block 7, the respective access conflict avoidance circuits perform the access conflict avoiding operations independently for memory blocks 7 and 8. If access conflict detection circuits 1 and 2 detect no access conflict, a conflict avoidance determination result from one access conflict avoidance circuit 4 is supplied and transmitted to memory blocks 7 and 8. In this case, since no conflict avoiding operation is carried out in the circuit 4 in order to make a port selection for avoiding the access conflict, access is made in the same way as under normal circumstances in each memory block according to external accessing request, so that no problem is caused even if only one access conflict avoidance circuit is connected to the two memory blocks 7 and 8.

Figure 12:
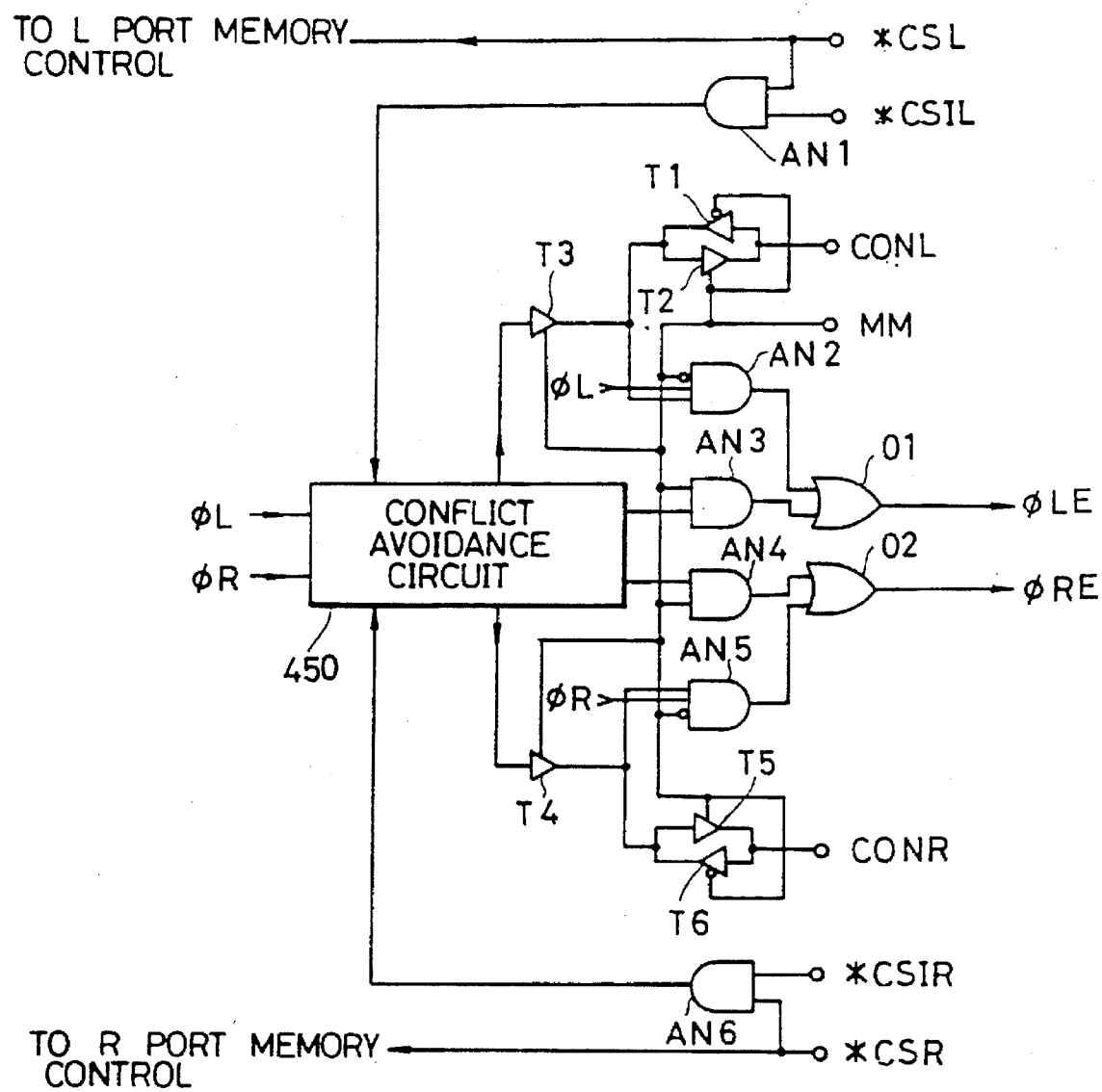
FIG. 12 is a diagram showing a structure of an access conflict avoidance control portion used in the dual port memory shown in FIG. 11.

A brief description will now be made of a specific structure of an access conflict avoidance circuit and a memory block. The structure of the conflict avoidance control circuit shown in FIG. 12 can be employed as this access conflict avoidance circuit. In this case, internal control signals $\phi LE$ and $\phi RE$ are supplied to each port as control signals for the A port and the B port, respectively, and each input/output circuit is responsively enabled/disabled.

It may also be applied in the same way to a case where the internal control signals $\phi L$ and $\phi R$ are internal address signals. That is, when memory blocks 7 and 8 have stored byte data and access is made on a word basis, in many cases, the byte data constituting the word data is stored in the same address region of both memory blocks 7 and 8. Accordingly, if an access conflict is caused in both of them, it is possible to correctly select a memory cell even if an address for one memory circuit is transmitted to the other memory circuit as an address. A specific structure of the access conflict avoidance circuit will now be described in the following.

Figure 2:
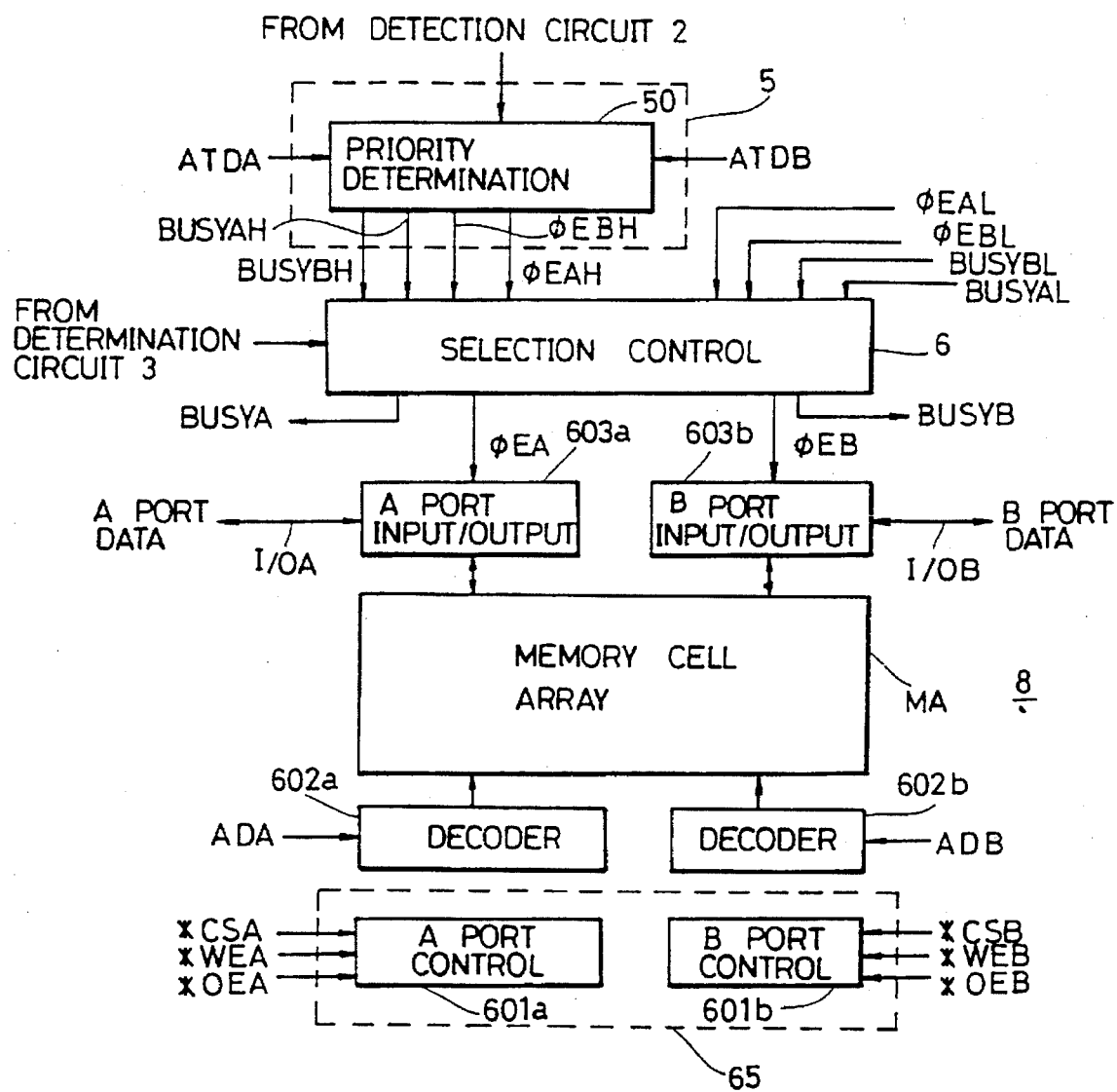
FIG. 2 is a diagram showing one example of a structure of a portion related to the memory for high order byte data shown in FIG. 1.

FIG. 2 is a diagram schematically showing a structure of a portion related to the high order byte memory block 8 shown in FIG. 1.

In FIG. 2, memory block 8 includes a memory cell array MA having memory cells arranged in rows and columns, an A port decoder 602a for decoding an A port address ADA and selecting a corresponding memory cell of memory cell array MA, a B port decoder 602b for B port for decoding an address ADB and selecting a corresponding memory cell of memory cell array MA, a control circuit 65 responsive to various externally applied control signals, i.e., chip select signals *CSA and *CSB, write enable signals *WEA and *WEB and output enable signals *OEA and *OEB for generating an internal clock signal providing operation timing to each port, an A port input/output circuit 603a for inputting/outputting data into/from a selected memory cell of memory cell array MA, and a B port input/output circuit 603b for inputting/outputting data into/from a memory cell selected by the B port address ADB in memory cell array MA.

Control circuit 65 includes an A port control circuit 601a responsive to control signals *CSA, *WEA and *OEA for the A port for generating a control signal for the A port, and a B port control circuit 601b responsive to control signals *CSB, *WEB and *OEB for the B port for generating various internal control signals for the B port. A port input/output circuit 603a inputs/outputs A port data A/OA and B port input/output circuit 603b inputs/outputs B port data I/OB.

Access conflict avoidance circuit 5 includes a priority determination circuit 50 responsive to an address transition detection signal ATDA for detecting the point of transition of the A port address ADA and an address transition detection signal ATDB for the B port address ADB for determining priority, depending on which transition is made earlier. Priority determination circuit 50 is activated in response to an access conflict detection signal from detection circuit 2 to determine priority. Priority determination circuit 50 generates port enable signals φEAH and φEBH and access inhibit signals BUSYAH and BUSYBH according to the determination result. The access inhibit signal BUSYAH is a busy signal for the A port and the access inhibit signal BUSYBH is a busy signal for the B port.

The signals φEAH and φEBH and the access inhibit signals BUSYAH and BUSYBH from the priority determination circuit 50 and the signals φEAL and φEBL and access inhibit signals BUSYBL and BUSYAL from avoidance circuit 4 are transmitted to selection control circuit 6. Selection control circuit 6 selects and transmits either of the signals for the high order byte data and the control signals for the low order byte data in response to the output signal of determination circuit 3. Selection control circuit 6 generates an A port enable signal φEA, a B port enable signal φEB, an A port access inhibit signal BUSYA and a B port access inhibit signal BUSYB. The A port access enable signal φEA is supplied to A port input/output circuit 603a and the B port enable signal φEB is supplied to B port input/output circuit 603b.

If an access conflict is caused, either one of the A port enable signal φEA and the B port enable signal φEB is activated and a corresponding input/output circuit is enabled. Accordingly, in this case, even if decoders 602a and 602b carry out a decoding operation according to control signals from control circuits 601a and 601b, data is not input into/output from the selected memory cell, through the inhibited port so that it is possible to input/output data without causing an access conflict and destruction of memory cell data. Input/output control signals are supplied to input/output circuits 603a and 603b from control circuits 601a and 601b and the input/output control signals are enabled/disabled by the signals φEA and φEB. If there is no access conflict, both of the enable signals φEA and φEB are activated.

In the structure shown in FIG. 2, it is also possible to combine control circuit 65 and priority determination circuit 50 into one circuit block to provide an access conflict avoidance circuit. In this case, the output of priority determination circuit 50 and various internal control signals from control circuit 65 are supplied to selection control circuit 6.

Figure 3:
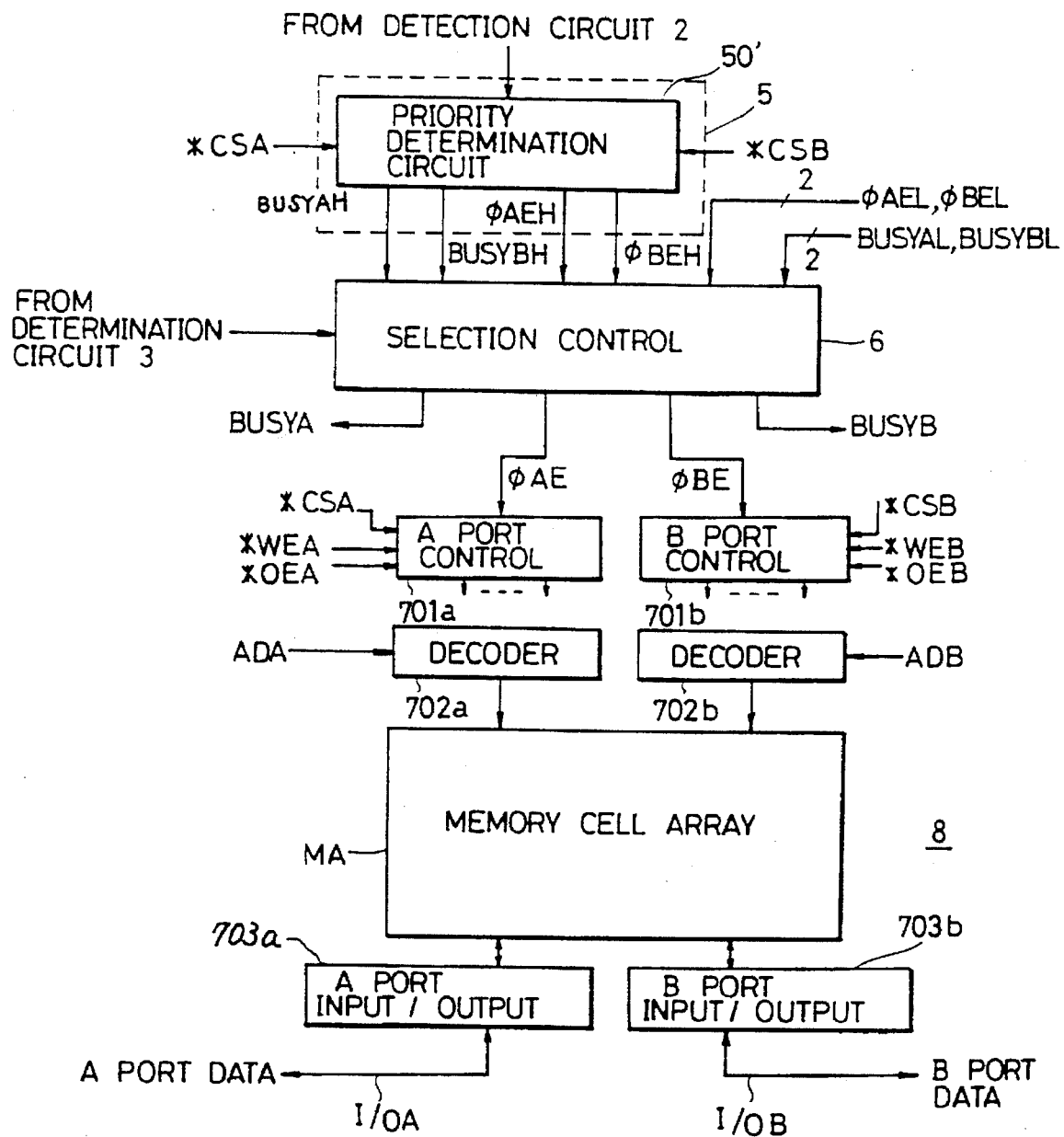
FIG. 3 is a diagram showing another example of the structure of the portion related to the memory for the high order byte data shown in FIG. 1.

FIG. 3 is a diagram showing still another structure of the portion related to the high order byte memory block 8. In FIG. 3, access conflict avoidance circuit 5 includes a priority determination circuit 50' for determining priority in accordance with a chip select signal *CSA for the A port and a chip select signal *CSB for the B port. Priority determination circuit 50' is activated in response to an access conflict detection signal from detection circuit 2, determines which of the chip select signals *CSA and *CSB was activated first, selectively activates the A port enable signal φAEH and the B port enable signal φBEH in accordance with the determination result, and selectively generates an A port access inhibit signal BUSYAH and a B port access inhibit signal BUSYBH. If there is no access conflict, the signals *CSA and *CSB are transmitted as enable signals φAEH and φBEH.

Selection control circuit 6 has the same structure as that shown in FIG. 2 and selectively transmits either of control signals from access conflict avoidance circuit 5 and an A port enable signal φAEL, a B port enable signal φBEL, an A port access inhibit signal BUSYAL and a B port access inhibit signal BUSYBL from access conflict avoidance circuit 4 for low order byte data. An A port enable signal φAE and a B port enable signal φBE are generated from selection control circuit 6 and supplied to an A port control circuit 701a and a B port control circuit 701b, respectively.

A port control circuit 701a generates an internal control signal in response to the control signals *CSA, *WEA and *OEA, which is enabled/disabled in response to the port enable signal φAE. B port control circuit 701b generates various internal control signals in response to the control signals *CSB, *WEB and *OEB. B port control circuit 701b is enabled/disabled in response to a B port enable signal φBE. A port control circuit 701a and B port control circuit 701b may be adapted so that generation of an internal write instructing signal and an internal read instructing signal is only inhibited in response to the A port enable signal φAE and the B port enable signal φBE, respectively, or may be adapted so that the decoding operation of an A port decoder 702a and a B port decoder 702b is also enabled/disabled.

In the structure shown in FIG. 3, though the A port enable signal φAE and the B port enable signal φBE are shown not supplied to an A port input/output circuit 703a and a B port input/output circuit 703b, internal write/read instructing signals are generated or not generated depending from A port control circuit 701a and B port control circuit 701b on whether or not there is an access conflict. Thus, the operations of A port input/output circuit 703a and B port input/output circuit 703b are controlled so that the access conflict can be avoided.

Figure 4:
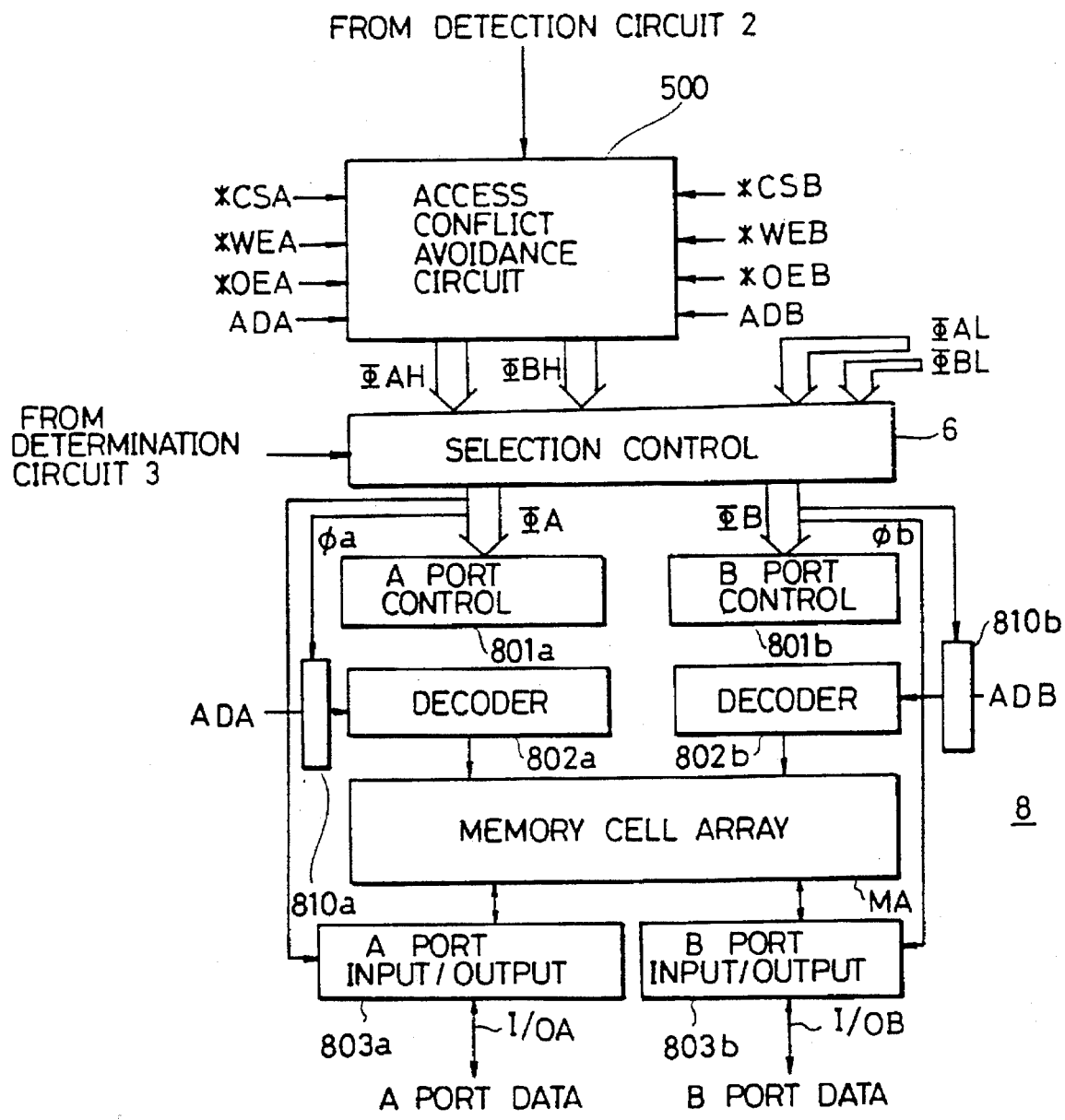
FIG. 4 is a diagram showing still another example of the structure of the portion related to the memory for the high order byte shown in FIG. 1.

FIG. 4 is a diagram showing an example of still another structure of the portion related to high order byte data memory block 8. In FIG. 4, an access conflict avoidance circuit 500 receives signals *CSA, *WEA and *OEA and an address ADA externally supplied for the A port and control signals *CSB, *WEB and *OEB and an address ADB externally supplied for the B port, performs the access conflict avoiding operation in response to a detection result signal from detection circuit 2, and supplies a control signal ΦAH for the A port and a control signal ΦBH for the B port according to the result of the avoidance determination.

Selection control circuit 6, in accordance with a determination result signal from determination circuit 3, selectively passes either control signals ΦAH and ΦBH from access conflict avoidance circuit 500 or control signals ΦAL and ΦBL for the A port and the B port from access conflict avoidance circuit 4 provided for the memory block of low order byte data. A control signal ΦA from selection control circuit 6 is supplied to an A port control circuit 801a and a control signal ΦB for the B port is supplied to a B port control circuit 801b. A port control circuit 801a and B port control circuit 801b generate internal control signals according to the states of the port enable signals ΦA and ΦB supplied from selection control circuit 6.

The internal port enable signals ΦA and ΦB include address selection signals Φa and Φb, which are supplied to address transmission circuits 810a and 810b, respectively. Address transmission circuit 810a transmits an address ADA to a decoder 802a in response to the control signal Φa included in the port enable signal ΦA. Address transmission circuit 810b transmits a B port address ADB to a decoder 802b in response to the control signal Φb included in the internal control signal ΦB. If the addresses ADA and ADB are external addresses, address transmission circuits 810a and 810b may be address buffers. If the addresses ADA and ADB are internal addresses generated from an address buffer, address transmission circuits 810a and 810b are provided between the address buffer and decoders 802a and 802b, respectively.

The port enable signal ΦA also includes a signal for controlling the operation of an A port input/output circuit 803a, which may be an internal write/read control signal. The port enable signal ΦB includes a signal for controlling the operation of an B port input/output circuit 803b, which may include an internal write/read control signal.

In the structure shown in FIG. 4, address transmission circuits 810a and 810b may be provided inside of access conflict avoidance circuit 500. That is, selection control circuit 6 may be adapted to transmit an address. In this case, when the high order byte data and the low order byte data are accessed on a word basis, the same address is generally transmitted for a high order data and a low order data, causing no malfunction for memory selection.

Though the structure of access conflict avoidance circuit 5 has been described, any structure is acceptable as far as it is structured so that the conflict avoiding operation for the memory block is selectively controlled according to the determination result in the access conflict avoidance circuit, and it is apparent that the present invention is not limited to the structures shown in FIGS. 2 to 4. For example, the dual port memory may generate an internal clock signal according to an address transition detection signal.

Figure 5:
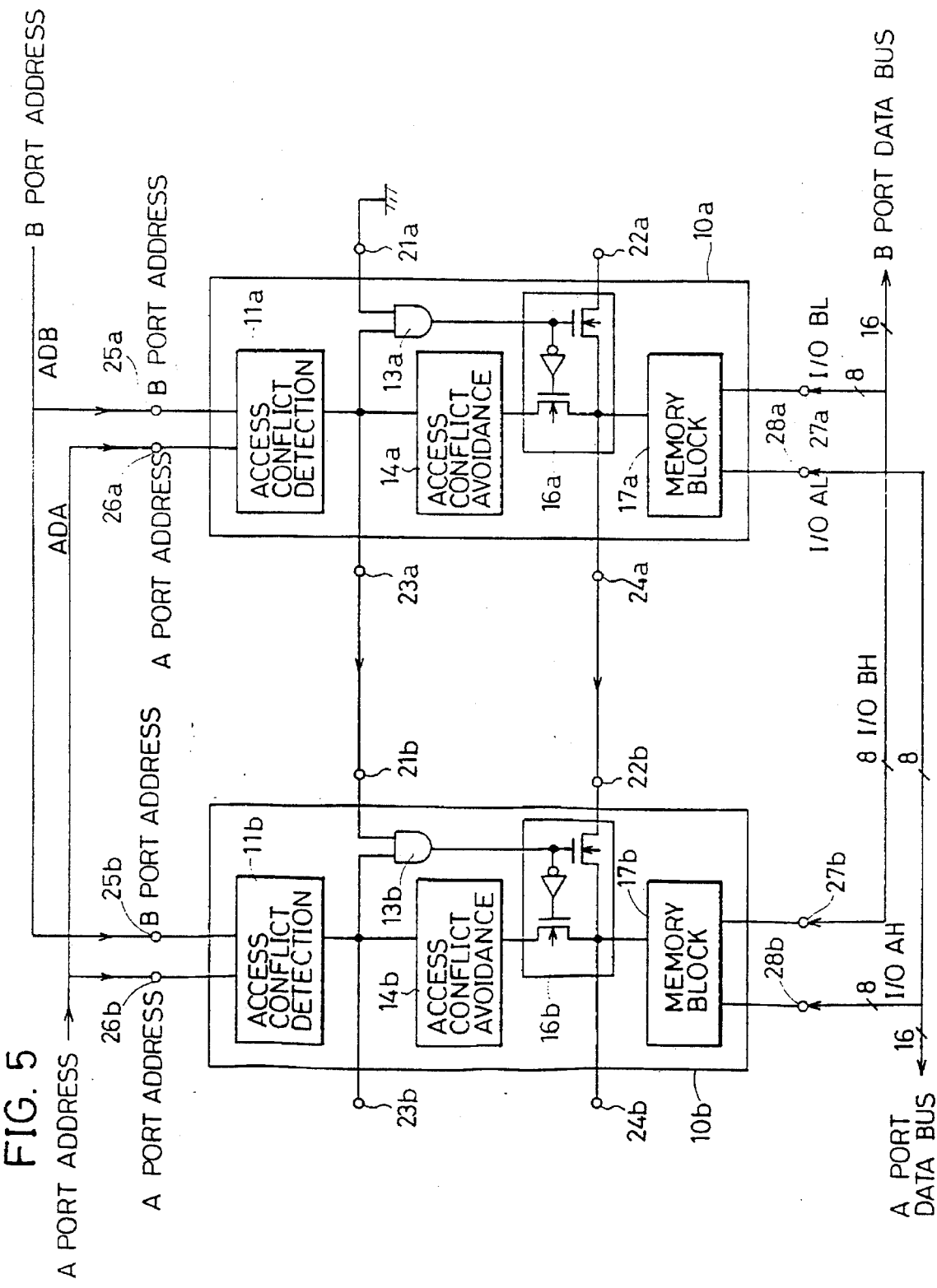
FIG. 5 is a diagram showing an example of the structure of a dual port memory system in accordance with another embodiment of the present invention.
Figure 6:
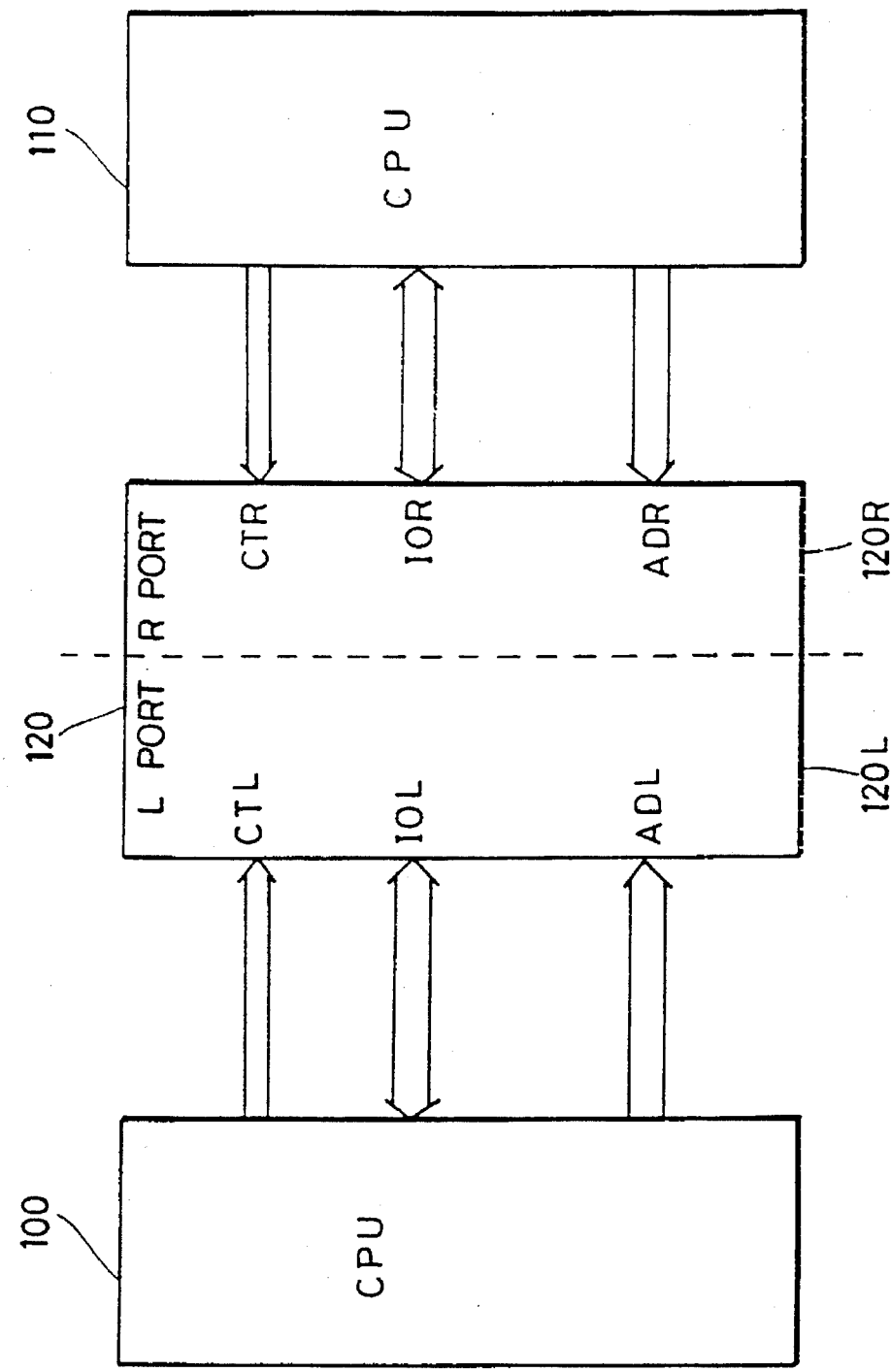
FIG. 6 is a diagram showing an example of a structure of a multiprocessor system.
Figure 7:
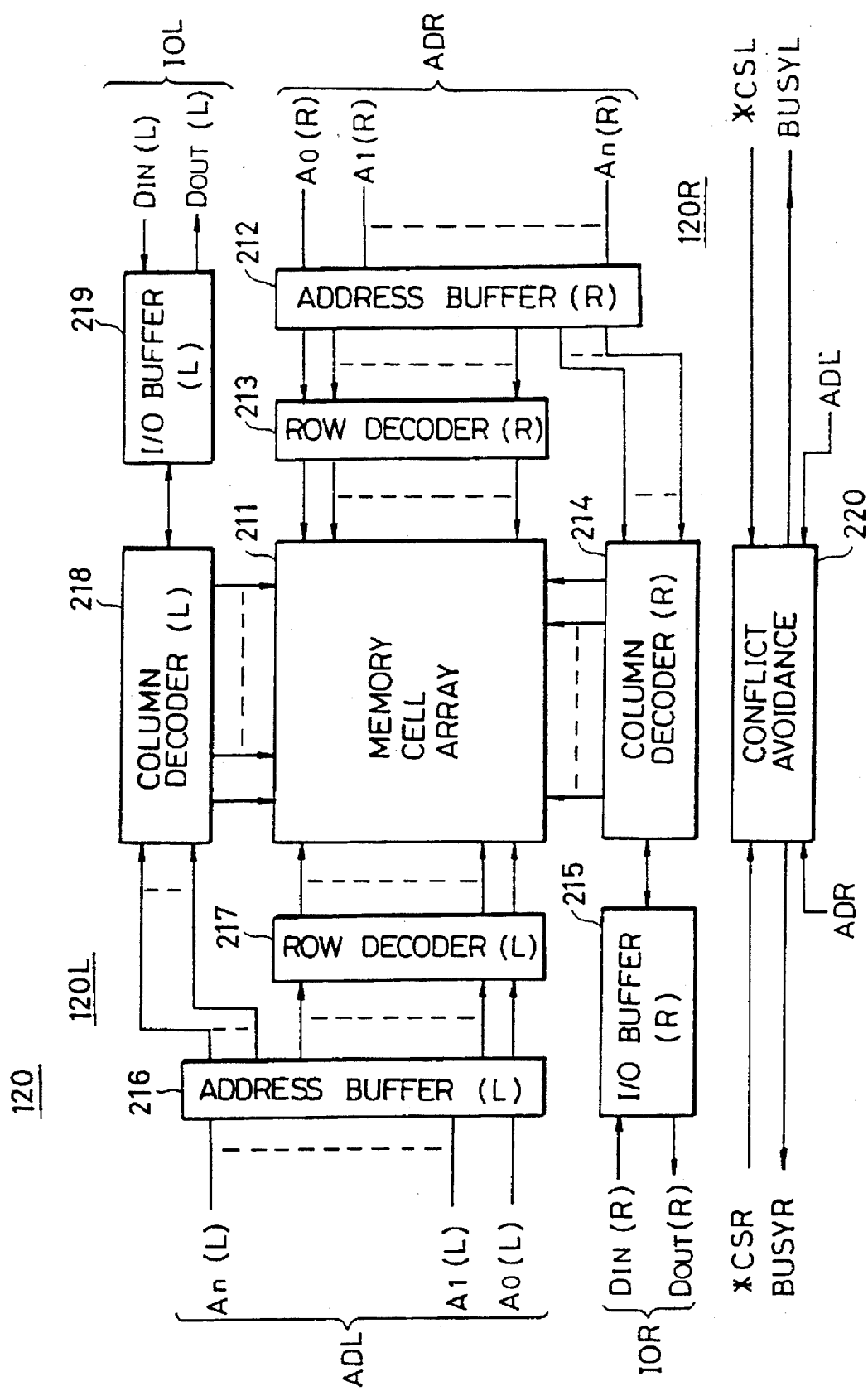
FIG. 7 is a diagram showing one example of a specific structure of a conventional dual port memory.
Figure 8:
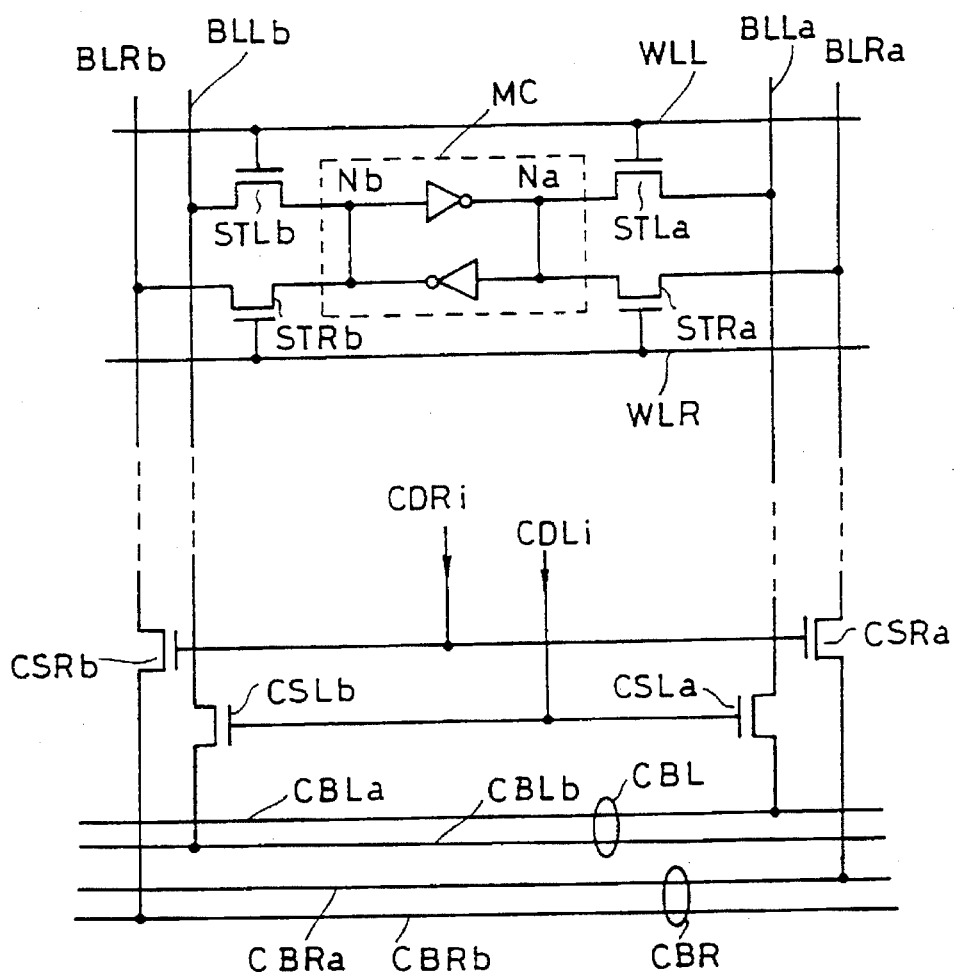
FIG. 8 is a diagram showing a specific structure of a memory cell array in the dual port memory.
Figure 9:
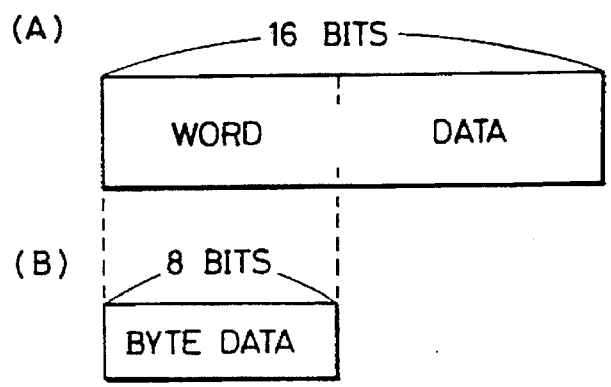
FIG. 9 is a diagram showing a structure of data used in a 16-bit CPU system.
Figure 10:
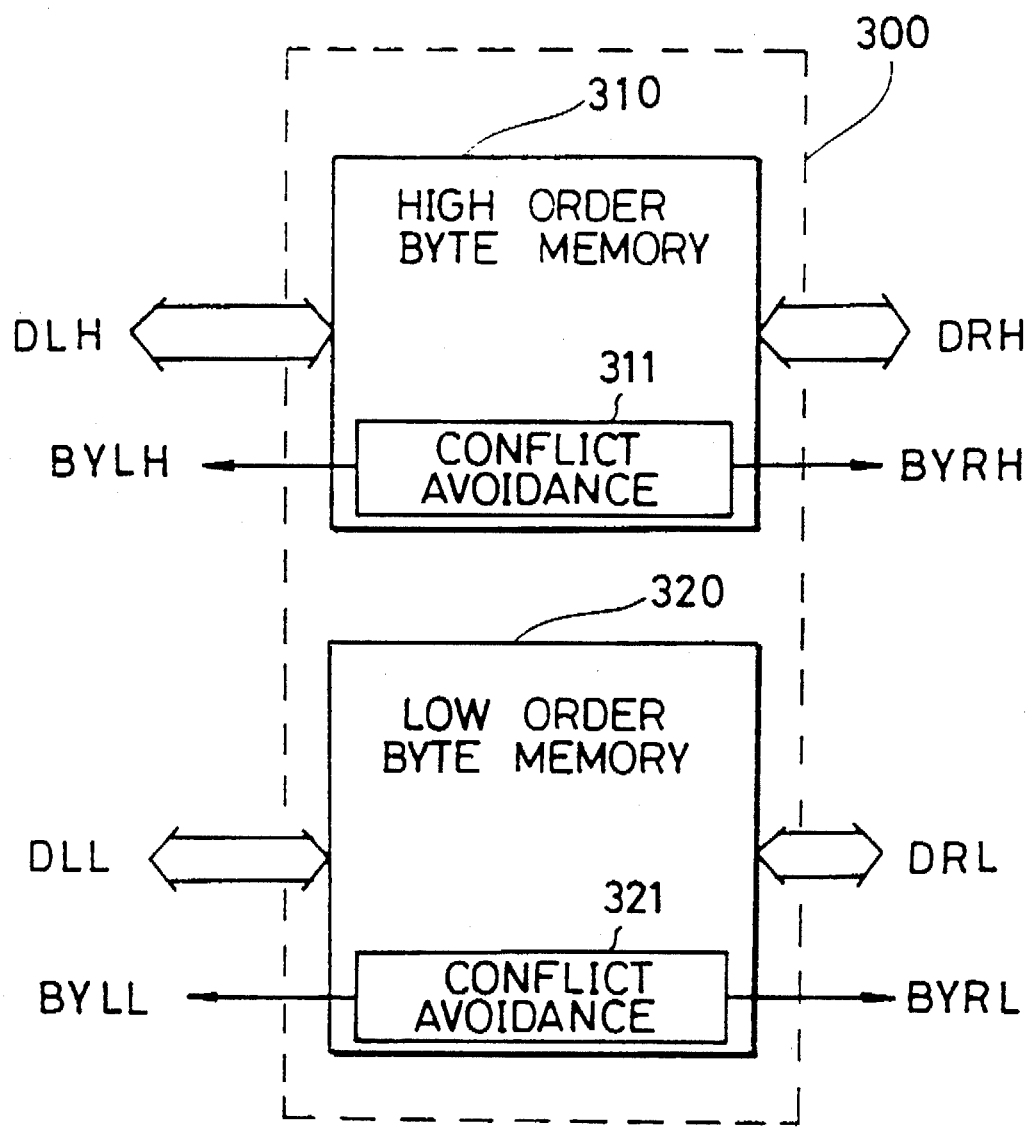
FIG. 10 is a diagram showing a structure of a memory block of a dual port memory in the 16-bit CPU system.
Figure 11:
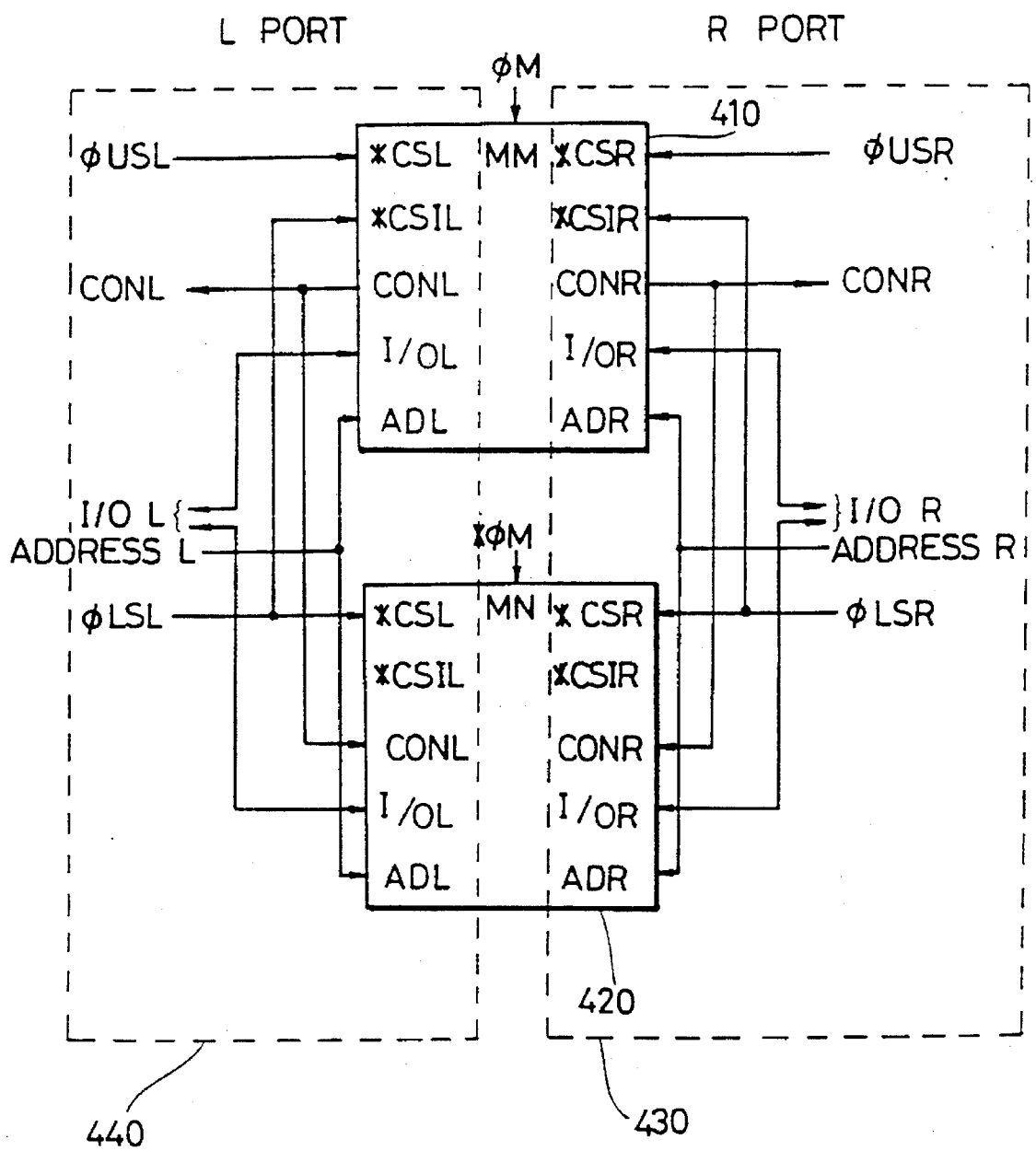
FIG. 11 is a diagram showing an example of a structure of an access conflict avoidance circuit in the conventional dual port memory.

FIG. 5 is a diagram showing an example of still another structure of the dual port memory according to the present invention. In the structure shown in FIG. 1, memory blocks of 16 bits, i.e., memory block 7 for high order byte data and memory block 8 for low order byte data are integrated in one memory 90. In the structure shown in FIG. 5, one memory chip provides a dual port memory for inputting/outputting data on a 16-bit basis using dual port memories capable of inputting/outputting data only on an 8-bit basis.

In FIG. 5, a first dual port memory 10a and a second dual port memory 10b are provided in parallel. The first dual port memory 10a includes as signal input/output terminals a B port address input terminal 25a for receiving an externally applied address ADB for a B port, an address input terminal 26a for receiving an A port address ADA, an access conflict detection result signal input terminal 21a, an access conflict control signal input terminal 22a, a B port data input terminal 27a for supplying data for the B port, a data input/output terminal 28a for inputting/outputting data for the A port, an access conflict control signal output terminal 24a for supplying a control signal for avoiding an access conflict, and an access conflict detection result signal output terminal 23a.

The first dual port memory 10a includes, as its internal circuits, an access conflict detection circuit 11a for detecting whether or not an access conflict is caused according to addresses ADB and ADA supplied to address input terminals 25a and 26a, an access conflict avoidance circuit 14a for performing the access conflict avoiding operation according to an output of access conflict detection circuit 11a, a determination circuit 13a for receiving an output of access conflict detection circuit 11a and a signal at access conflict detection result signal input terminal 21a and determining whether or not it is necessary to control access conflict avoidance, a selection control circuit 16a responsive to an output of determination circuit 13a for selectively passing either of a control signal from access conflict avoidance circuit 14a and an access conflict control signal from access conflict control signal input terminal 22a, and a memory block 17a which is operated in response to an output of selection control circuit 16a.

The second dual port memory 10b includes an access conflict detection result signal input terminal 21b, an access conflict control signal input terminal 22b, a B port data input/output terminal 27b, an A port data input/output terminal 28b, an access conflict control signal output terminal 24b, an access conflict detection result signal output terminal 23b, a B port address input terminal 25b and an A port input terminal 26b as external terminals in the same way. The second dual port memory 10b further includes, as internal circuits, an access conflict detection circuit 11b, an access conflict avoidance circuit 14b, a determination circuit 13b, a selection control circuit 16b and a memory block 17b in the same way.

The first dual port memory 10a is employed as a memory block for inputting/outputting low order byte data and second dual port memory 10b is employed as a memory block for inputting/outputting high order byte data. That is, low order byte data I/OAL of the A port is input to/output from A port data input/output terminal 28a of the first dual port memory 10a and low order byte data I/OBL is input to/output from B port data input/output terminal 27a. In the second dual port memory 10b, high order byte data I/OBH is input to/output from B port data input/output terminal 27b and high order byte data I/OAH is input to/output from A port data input/output terminal 28b.

The control signal input/output terminals are connected to each other in order that the two dual port memories 10a and 10b may avoid an access conflict. Access conflict detection result signal input terminal 21a of the first dual port memory 10a is connected to the ground potential. Access conflict control signal input terminal 22a of the first dual port memory 10a is brought to an open state, i.e., a high impedance state. Access conflict detection result signal output terminal 23a of the first dual port memory 10a is connected to access conflict detection result signal input terminal 21b of the second dual port memory 10b. Access conflict control signal output terminal 24a of the first dual port memory 10a is connected to access conflict control signal input terminal 22b of the second dual port memory 10b. Access conflict detection result signal output terminal 23b and access conflict control signal output terminal 24b of the second dual port memory 10b are brought to the open state. In this connecting arrangement, determination circuit 13a is disabled, and does not perform a determining operation. An access conflict control signal, i.e., an access conflict determination result signal from access conflict avoidance circuit 14a is transmitted to memory block 17a all the time. The access conflict determination result, i.e., the access conflict control signal of access conflict avoidance circuit 14a is also transmitted to selection control circuit 16b of the second dual port memory 10b through selection control circuit 16a and terminals 24a and 22b.

Determination circuit 13b controls the selecting operation of selection control circuit 16b according to access conflict detection signals of access conflict detection circuits 11a and 11b. Accordingly, also in this arrangement, the same operation as in the structure shown in FIG. 1 is carried out and a most suitable access conflict avoiding operation is performed according to the combination of access conflicts caused.

In the above description, the memory blocks 10a and 10b can be independently accessed on the 8-bit basis and such two memory blocks where data is written/read out on the 8-bit basis are applied to a 16-bit CPU system. For a 32 bit CPU system with two memory blocks each capable of being accessed on a 16 bit basis, the same effect can be achieved as in the above-mentioned embodiment as far as these memory blocks are provided with the controlling circuitry shown in FIG. 5.

Though only two memory blocks are used in the embodiment above, the same effect can be realized by extending the structure if four memory blocks are used where data is written/read out on the 8-bit basis in the 32-bit CPU system. That is, for example, first determination circuits are provided for memory blocks of data of high order 16 bits and low order 16 bits, respectively, and a corresponding selection control circuit is driven according to outputs of the determination circuits. And if there are access conflicts both in the memory blocks of data of high order 16 bits and low order 16 bits, the access conflicts can be efficiently avoided in the same way by transmitting an output of either one of the access conflict avoidance circuits, i.e., an access conflict control signal to all the memory blocks.

In the embodiment described above, in the case of the structure where a common address is provided to all the memory blocks and switching of byte data and word data is performed by a chip select signals with each memory block operating independently, both of the chip select signals and the address are supplied as control signal to the access conflict detection circuit to determine whether or not an access conflict is caused by comparing addresses when all the chip select signals are activated.

In a case where the address width for a 16 bit data is larger than that for an 8-bit data, if two respective address portions for selecting low order byte data and for selecting high order byte data are supplied to the memory independently, the both address portions may be simply provided to the access conflict detection circuit.

Furthermore, in a structure where odd-numbered addresses are allocated to the memory block for low order byte data, even-numbered addresses are allocated to the high order byte memory block, and an address bit indicating even/odd of an address is used as a part of the chip select signal, high order byte data, low order byte data and word data are designated according to a combination of an even/odd address bit including an address bit A0 and a byte high enable signal indicating that a selected even numbered address data is to be transmitted on a high order byte data bus. High order byte data selection is enabled by the byte high enable signal and low order byte data selection is enabled by the address bit A0 in a word data arrangement. More specifically, if the byte high enable signal is active, a high order byte data is transferred onto a high order byte data bus. If the byte high enable signal is non-active, only a low order byte data bus is coupled to selected byte cells. Determination on a byte data and a word data is made according to the combination of the byte high enable signal and the address bit A0. In this case, the byte high enable signal is also supplied to the access conflict detection circuit to detect the access conflict. The decoder circuit decodes the address excluding the address bit A0.

As stated above, in accordance with the present invention, in a multiport memory including a plurality of memory blocks each operating independently and independently accessible through a plurality of ports, the access conflict avoidance for the memory blocks is controlled by using selectively a determination result signal of an access conflict avoidance circuit provided corresponding to each memory block and supplying the same to the memory blocks according to the occurrence of an access conflict for each memory block. Accordingly, it is possible to effectively carry out a most suitable access conflict avoidance control and to reduce an access conflict avoidance processing time. The access conflict avoidance determination result signal is selectively used according to the occurrence of the access conflict, so that the access conflict can be avoided with a simplified control circuit and a multiport memory capable of correctly writing/reading data can be provided. Additionally, since it is not necessary to externally provide a complicated control signal and the access conflict is avoided internally with a simplified circuit structure, an economical and highly reliable multiport memory can be provided in which destruction of data due to the access conflict is not caused.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A multiport memory including a first port and a second port which can be accessed independently from each other, comprising:

a plurality of memory blocks each having an array of memory cells, each said memory block being accessible through said first and second ports, each of said first and second ports including a plurality of subports corresponding to said plurality of memory blocks;

a plurality of access conflict detecting means, one for each said memory block, each for determining whether or not an access through a subport of said first port to a corresponding memory block conflicts with an access through a subport of said second port to the corresponding memory block in response to address signals for the first and second ports;

a plurality of arbitrating means provided corresponding to each respective access conflict detecting means and responsive to an associated access conflict detecting means for effecting an arbitration for avoiding an access confliction to generate an enabling signal for allowing an access to a preferential port;

selection means responsive to said plurality of access conflict detecting means for selectively passing the enabling signal from one of said plurality of arbitrating means; and, port control means provided for each respective memory block and responsive to said selection means for enabling an access to a port enabled by the enabling signal received from said selection means, said selection means responsive to a multiple of the access conflict detecting means simultaneously detecting access conflictions in corresponding memory blocks, for selecting and passing an enabling signal from one of arbitration means corresponding to the multiple of the access conflict detecting means to each respective port control means provided corresponding to memory blocks subject to the simultaneous access conflictions.

2. A multiport memory according to claim 1, wherein said selection means includes determination means responsive to said plurality of access conflict detecting means for determining whether or not all of said access conflict detecting means detect an access confliction, and gate means responsive to said determination means for passing the output of only one of said plurality of arbitrating means to each said port control means when said determination means determines that all of said access conflict detecting means detect the access confliction.

3. A multiport memory according to claim 1, wherein said memory blocks include a first memory block and a second memory block and wherein said selection means includes (a) determination means responsive to two access conflict detecting means provided for said first and second memory blocks, for determining whether or not both said two access conflict detecting means detect an access confliction, (b) a first transfer means for transferring the enabling signal from the arbitrating means for the first memory block to the port control means for the first memory block, and (c) a second transfer means responsive to said determination means for selectively passing one of the enabling signals from the arbitrating means for the first memory block and the arbitrating means for the second memory means to the port control means for the second memory block.

4. A multiport memory according to claim 3, wherein said second transfer means transfer the enabling signal from the arbitrating means when said determination means indicates that both said associated two access conflict detecting means detect the access confliction.

5. A multiport memory according to claim 3, wherein the number of said memory blocks is 2, and one memory block provides a high order byte data storage, and the other memory block provides a low order byte data storage.

6. A multiport memory according to 3, wherein said first and second memory blocks are integrated on the same semiconductor chip.

7. A multiport memory according to claim 3, wherein one of said first and second memory blocks provides a high order byte data storage, and the other provides a low order byte data storage.

8. A multiport memory according to claim 3, wherein said first and second memory blocks are formed on separate first and second semiconductor chips respectively, and wherein said first semiconductor memory chip includes an additional determining means receiving an output of the access conflict detecting means for the first memory block and fixed to a disable state, and gating means as said first transfer means responsive to said additional determining means, whereby said first and second semiconductor chips have the same component arrangement with each other.

9. A method of avoiding an access confliction in a multiport memory having independently accessible first and second ports, said multiport memory including a first memory block and a second memory block, said method comprising the steps of:

independently determining whether or not there is an access confliction between an access through said first port and an access through said second port in said first memory block and in said second memory block;

carrying out an arbitration operation on an access to a memory block causing an access confliction to allow an access through one of said first and second ports while allowing accesses through the first and second ports of a memory block causing no access confliction, when only one of the first and second memory blocks is subject to the access confliction, and carrying out an arbitration operation on accesses to both the first and second memory blocks to allow an access to the first and second memory blocks through one of said first and second ports determined by the arbitration operation carried out for one of the first and second memory blocks, when both the first and second memory blocks are subject to the access confliction.

* * * * *